United States Patent
Richter

(10) Patent No.: US 7,296,202 B2
(45) Date of Patent: Nov. 13, 2007

(54) SEMICONDUCTOR MODULE WITH A CONFIGURATION FOR THE SELF-TEST OF A PLURALITY OF INTERFACE CIRCUITS AND TEST METHOD

(75) Inventor: Detlev Richter, München (DE)

(73) Assignee: Infineon Technologies AG, Munich (DE)

( * ) Notice: Subject to any disclaimer, the term of this patent is extended or adjusted under 35 U.S.C. 154(b) by 959 days.

(21) Appl. No.: 10/075,656

(22) Filed: Feb. 13, 2002

(65) Prior Publication Data
US 2002/0112206 A1    Aug. 15, 2002

(30) Foreign Application Priority Data
Feb. 13, 2001 (DE) .................... 101 06 556

(51) Int. Cl.
*G01R 31/28* (2006.01)
(52) U.S. Cl. .............. 714/728; 714/733; 714/734; 714/738
(58) Field of Classification Search ............ 714/25, 714/30, 43, 44, 724, 728, 733–735, 738–739, 714/742
See application file for complete search history.

(56) References Cited

U.S. PATENT DOCUMENTS 5,751,151 A * 5/1998 Levy et al. .................. 324/537
6,477,674 B1 * 11/2002 Bates et al. ................. 714/738
6,704,897 B1 * 3/2004 Takagi ........................ 714/739
2003/0101376 A1 * 5/2003 Sanghani .................... 714/30
2003/0120989 A1 * 6/2003 Zumkehr .................... 714/738

FOREIGN PATENT DOCUMENTS

DE    198 32 307 A1    2/2000
DE    199 01 460 C1    8/2000

* cited by examiner

*Primary Examiner*—Guy Lamarre
*Assistant Examiner*—John J. Tabone, Jr.
(74) *Attorney, Agent, or Firm*—Laurence A. Greenberg; Werner H. Stemer; Ralph E. Locher

(57) ABSTRACT

A semiconductor module with a plurality of interface circuits has a configuration for the self-test of interface circuits, with two equally sized groups of interface circuits such that each interface circuit of the first group is assigned exactly one interface circuit of the second group. A circuit interacts with the first group and serves for generating test signals which can be output via the interface circuits of the first group. Another circuit interacts with the second group and serves for receiving and processing test signals received via the interface circuits of the second group, so that a connection of the assigned interface circuits of the first and second groups enables a self-test, the first and second groups of interface circuits having a separate voltage supply. This enables good test coverage by separate variation of the voltage of transmitting and receiving group.

13 Claims, 3 Drawing Sheets

SEMICONDUCTOR MODULE WITH A CONFIGURATION FOR THE SELF-TEST OF A PLURALITY OF INTERFACE CIRCUITS AND TEST METHOD

BACKGROUND OF THE INVENTION

Field of the Invention

The invention lies in the semiconductor technology field. More specifically, the present invention relates to a semiconductor module with a plurality of interface circuits and a configuration for the self-test of interface circuits. The application furthermore relates to a method for the self-test of interface circuits of such a semiconductor module.

All semiconductor modules communicate with other devices via I/O interface circuits. With fast interface circuits, for example LVDS (Low-Voltage Differential Signals) or DDR (Double Data Rate), the necessary functional tests require a very high accuracy with regard to timing control and voltage.

The most widespread test method uses external test systems having very high accuracy with regard to timing control and voltage, which are connected via a multiplicity of signal lines to the modules to be tested. However, this procedure is increasingly encountering its limits, since test systems having the high accuracy required for the present-day fast interface circuits are very costly and in some instances are not commercially available with the required specification.

One possibility for dispensing with an external test system consists in providing an on-chip test logic with PLL (Phase-Locked Loop) or DLL (Delay-Locked Loop). However, this procedure is very complex and requires a very large chip area for the integration of the high-precision PLL or DLL test logic.

Published German patent application DE 198 32 307 A1 discloses an integrated circuit with a self-test device for the self-test of the integrated circuit, in which an output of the self-test device is connected via an output drive to an external contact-making point of the circuit, which, for its part, is connected via an input driver to the input of the circuit unit to be tested. In the test operating mode, the self-test device passes a test signal via the output driver to the contact-making point and from there via the input driver to the circuit to be tested.

German patent DE 199 01 460 C1 discloses an integrated semiconductor circuit with a plurality of pad cells which each comprise a terminal pad and an output driver and can be monitored in an operating mode of the circuit using a functional test. In this case, a signal generator generates periodic signal sequences which are fed to the pad cell and the transfer response of the pad cell is measured externally at the output of the cell in the frequency domain.

This marks the starting point for the invention.

SUMMARY OF THE INVENTION

It is accordingly an object of the invention to provide a semiconductor component with a self-test configuration for a multiplicity of interface circuits and a test method, which overcomes the above-mentioned disadvantages of the heretoforeknown devices and methods of this general type and which enabling fast interface circuits of semiconductor modules to be tested reliably and with a low outlay.

With the foregoing and other objects in view there is provided, in accordance with the invention, a semiconductor module with a configuration for the self-test of a plurality bidirectionally operating interface circuits, comprising:

first and second equally sized groups of interface circuits, wherein each interface circuit of the first group is assigned exactly one interface circuit of the second group;

a respective electrical connection of the mutually assigned interface circuits of the first and second groups to an outside of the semiconductor module, for enabling a self-test;

a first circuit connected to the first group and serving to generate test signals to be multiplexed in and output via the interface circuits of the first group;

a second circuit connected to the second group for receiving and processing test signals received via the interface circuits of the second group; and a respective separate voltage supply for the first and second groups of interface circuits.

There is also provided a self-test method that comprises the following steps:

providing a semiconductor module as outlined above and testing the bidirectionally operating interface circuits of the semiconductor module by connecting the assigned interface circuits of the first and second groups of interface circuits outside the module;

supplying the two groups of interface circuits with a separate supply voltage;

generating test signals, coupling in the test signals, and outputting the test signals via the first group of interface circuits;

receiving the test signals via the second group of interface circuits; and comparing the received test signals with prescribed values for fault-free functioning of the interface circuits.

In other words, the invention achieves the above objects with a semiconductor module with a plurality of interface circuits has a configuration for the self-test of interface circuits, which comprises:

two equally sized groups of interface circuits such that each interface circuit of the first group is assigned exactly one interface circuit of the second group, a circuit which interacts with the first group and serves for generating test signals which can be output via the interface circuit of the first group;

a circuit which interacts with the second group and serves for receiving and processing test signals received via the interface circuits of the second group, so that a connection of the assigned interface circuits of the first and second groups enables a self-test, the first and second groups of interface circuits having a separate voltage supply.

The invention is thus based on the concept of utilizing the interface circuits for testing themselves. To that end, the interface circuits are divided into two groups and test signals are output via the first group of interface circuits. Via an external connection of the first group to the second group of interface circuits, during the self-test, the test signals pass to the second group of interface circuits, where the test signals are received and processed in a circuit.

In this case, the separate voltage supply of the first and second groups of interface circuits allows good test coverage by separate variation of the voltage of transmitting and receiving group.

In accordance with a preferred feature of the invention, the semiconductor module further has a circuit which interacts with the second group and serves for generating test signals which can be output via the interface circuit of the second group, and a circuit which interacts with the first group and serves for receiving and processing test signals received via the interface circuit of the first group. As a result, it is possible to test both groups of interface circuits, each group occurring on one occasion as transmitter and on one occasion as receiver of the test signals.

The circuit or the circuits for generating test signals advantageously comprise a pseudorandom number generator, in particular a linear feedback shift register (LFSR).

The circuit or the circuits for receiving and processing test signals advantageously comprise a circuit for calculating a signature from the test signals, in particular a multiple input shift register (MISR).

During the self-test of the interface circuits of such a semiconductor module, the assigned interface circuits of the first and second groups are connected to one another, the two groups are supplied with a separate supply voltage, test signals are generated and output via the first group of interface circuits, the test signals are received via the second group of interface circuits, and the received test signals are compared with prescribed values for fault-free functioning of the interface circuits.

In accordance with an added feature of the invention, both groups have a circuit for generating test signals, so that, after the processing of the test signals output by the first group and received by the second group of interface circuits, the test direction can be rotated. Then, the test signals generated by the circuit which interacts with the second group are output via the second group of interface circuits and are received via the first group of interface circuits, and the received test signals are compared with prescribed values for fault-free functioning of the interface circuits.

In accordance with a further refinement of the invention, the connection paths of the assigned interface circuits are influenced resistively, capacitively or inductively during testing, in order to increase the test coverage by including interference quantities in the self-test.

Furthermore, a low-frequency signal voltage can be modulated onto at least one of the supply voltages of the interface groups. Preferably, low-frequency sinusoidal signals of different frequency are modulated onto both supply voltages, thereby achieving a timing test which is very close to the application and even goes beyond the possibilities of an external test system.

Overall, the invention described permits a relatively short test time without necessitating high-precision test systems with regard to the timing control or voltage. The customary mismatch when the high-speed pins are capacitively coupled to the test system is obviated. Moreover, only a small additional hardware outlay arises on the semiconductor module, since no PLL or DLL logic is required.

In a production test, the test method described is expediently used after the packaging of the chips, since the boards are better suited to this than needle cards.

Other features which are considered as characteristic for the invention are set forth in the appended claims and in the drawing figures.

Although the invention is illustrated and described herein as embodied in a semiconductor module with a configuration for the self-test of a plurality of interface circuits and test method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
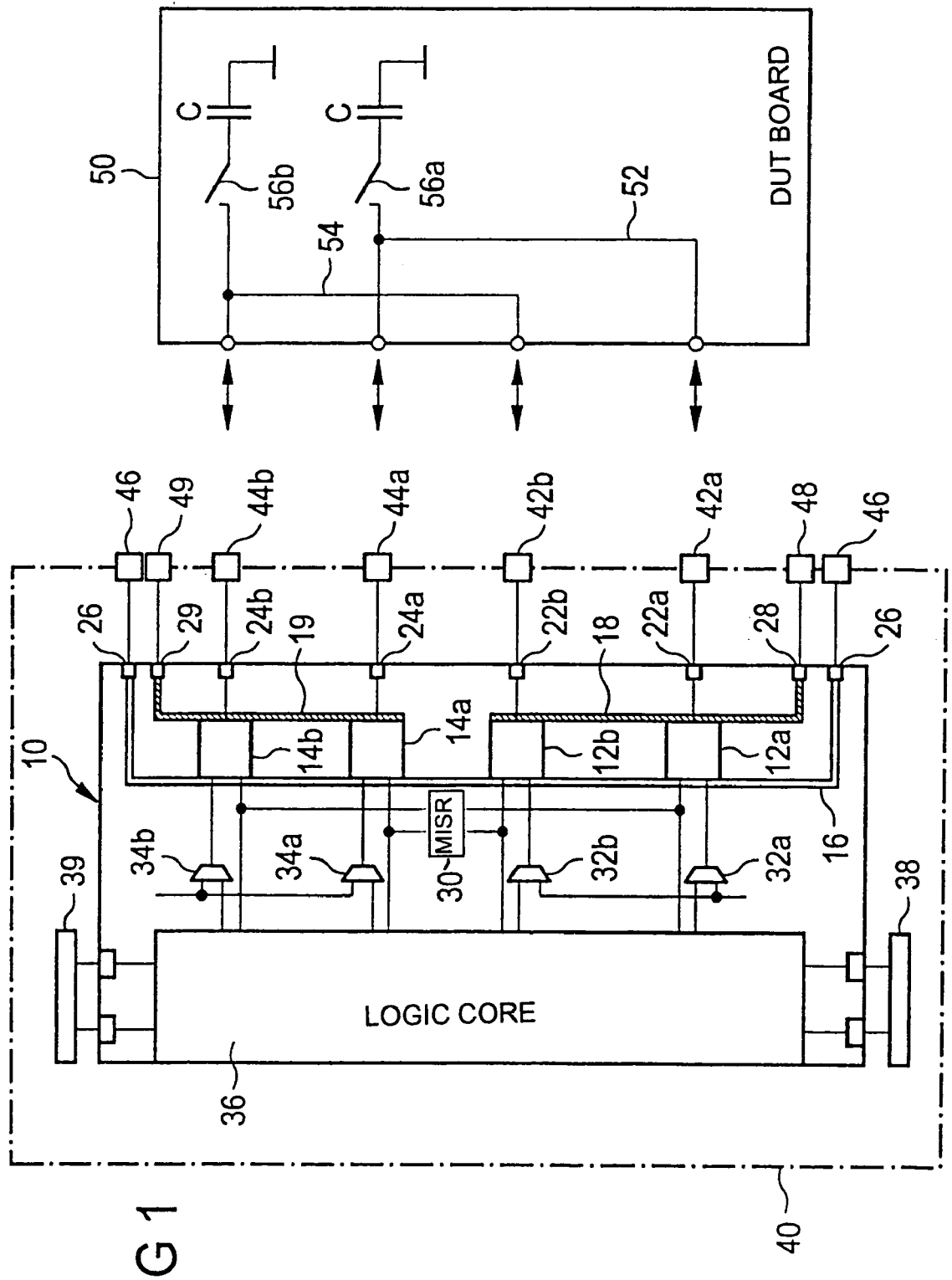
FIG. 1 is block schematic of an exemplary embodiment of the invention in a test with a DUT board.

Referring now to the figures of the drawing in detail and first, particularly, to FIG. 1 thereof, there is shown a semiconductor module 10 with a logic core 36 and I/O interface circuits 12a, 12b, 14a, 14b, which are assigned terminal pads 22a, 22b, 24a, 24b on the semiconductor module. In this case, in order to make the illustration easier to understand, the schematic illustration of FIG. 1 shows only four I/O interface circuits, whereas in real devices the number of I/O interface devices is generally greater than four, for example 16 or 32.

The interface circuits 12a-14b are divided into a first group, containing the interface circuits 12a and 12b, and a second group, containing the interface circuits 14a and 14b. The two groups each have a separate voltage supply. Although all the interface circuits 12a-14b share the negative supply voltage VSSP (reference symbol 16), the positive supply voltage VDDP1 (reference symbol 18) and VDDP2 (reference symbol 19) is respectively separate for the two groups and embodied via separate terminal pads 28, 29 on the semiconductor chip 10.

Each group of interface circuits is connected to a linear feedback shift register LFSR (reference symbols 32a, 32b and 34a, 34b, respectively) for generating pseudorandom-distributed test signals. Furthermore, both groups of interface circuits are connected to the common multiple input shift register (MISR) 30. The MISR 30 calculates from received test signals a signature which can be used for checking the correct reception of the test signals.

In the housed state, the semiconductor module 10 is situated in a package 40. The terminals of the interface circuits are routed out at pins 42-49 of the package. The supply voltage 38, 39 for the logic core 36 is additionally provided.

For the self-test, the semiconductor module 10 is connected to a DUT (Device Under Test) board 50. The DUT board 50 contains a connection 52, which connects the pin 42a to the pin 44a of the package and thus the interface circuit 12a to the interface circuit 14a. In the same way, the connection 54 connects the pins 42b and 44b of the package and thus the interface circuits 12b and 14b.

During test operation, first of all the LFSR 34a, 34b generates a series of test signals which are output via the interface circuits 14a, 14b and pass via the connections 52, 54 to the interface circuits 12a, 12b and from there to the MISR 30, which calculates a signature from the test signals. After a specific number of received test signals, the calculated signature is compared with a prescribed signature for fault-free functioning of the interface circuit.

Afterward, the test direction is rotated, that is to say the LFSR 32a, 32b then generates test signals which are output via the interface circuits 12a, 12b, are received via the connections 52, 54 and the interface circuits 14a, 14b and pass to the MISR 30 for evaluation.

In order to achieve high test coverage, the test is multiply iterated and the voltage at the separate power supplies 18, 48 and 19, 49, respectively, for the two interface halves is varied in the process. The separate power supply allows, for example, transmission at high voltage on one half of the interface circuit and reception on the other half of the interface circuit at low voltage.

Furthermore, via the switches 56a, 56b of the DUT board, the connections 52, 54 can be influenced in a targeted manner with interference quantities, with capacitive interference in the exemplary embodiment of FIG. 1. Instead of the capacitors C, the connections 52, 54 can also be influenced inductively or resistively with impedances or resistors.

Figure 2:
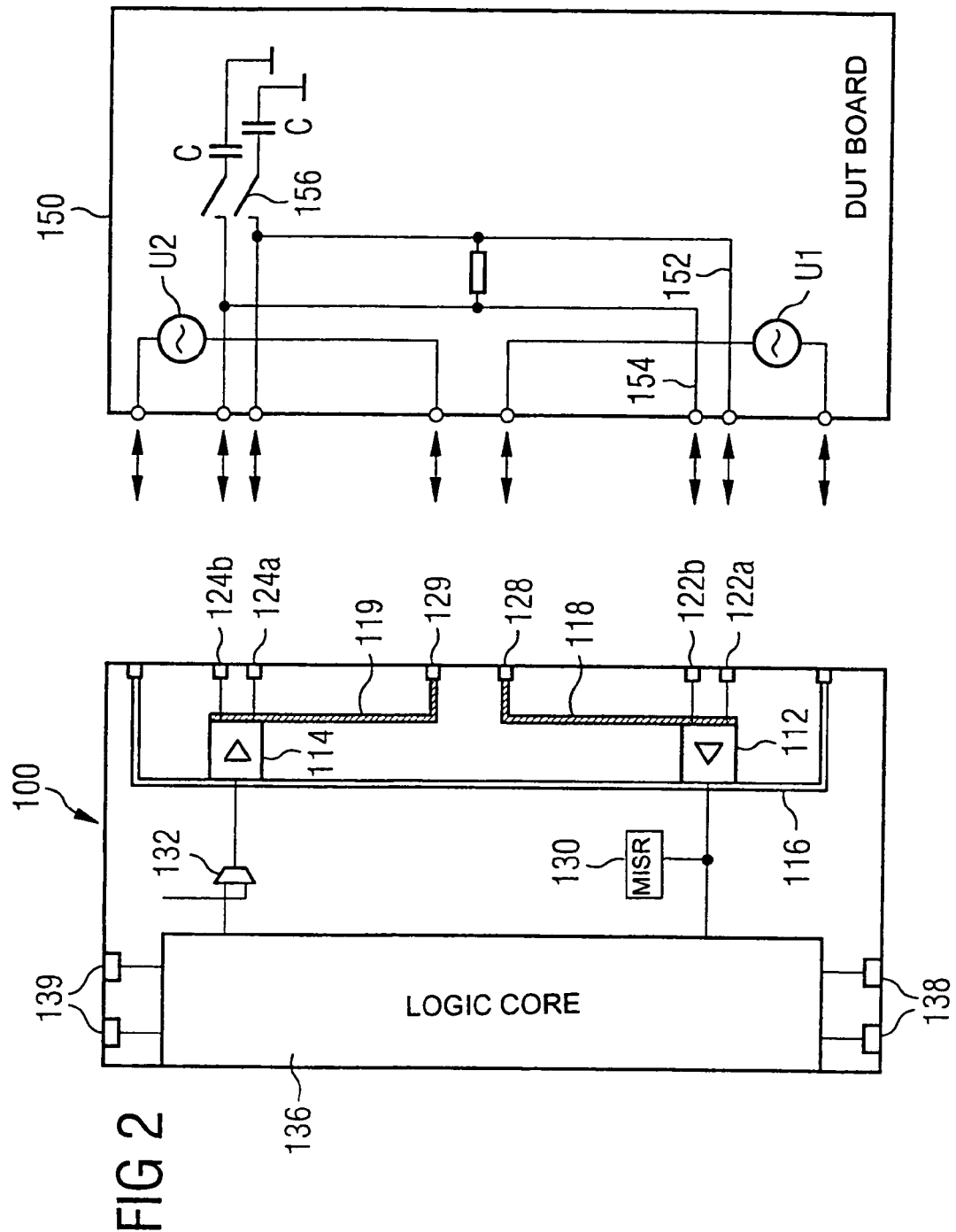
FIG. 2 is a block schematic of another exemplary embodiment of the invention in a test with a needle card.

FIG. 2 shows an LVDS (Low-Voltage Differential Signals) interface as a further exemplary embodiment of the invention. The semiconductor module 100 contains a logic core 136 with supply voltage terminals 138, 139, and two LVDS pad pairs 122a, 122b and 124a, 124b, which each belong to an LVDS input 112 and an LVDS output 114, respectively. Here, once more, the number of just two interface circuits is not intended to limit the invention, but rather is chosen merely for the sake of simpler illustration.

The two interface circuits 112, 114 have a common negative supply voltage VSSP (reference symbol 116) but a separate positive supply voltage VDDP1 (reference symbol 128) and VDDP2 (reference symbol 129), respectively. The LVDS output 114 is connected to an LFSR 132 for generating test signals, and the LVDS input 112 is connected to an MISR 130 for calculating a signature from the received test signals.

Figure 3:
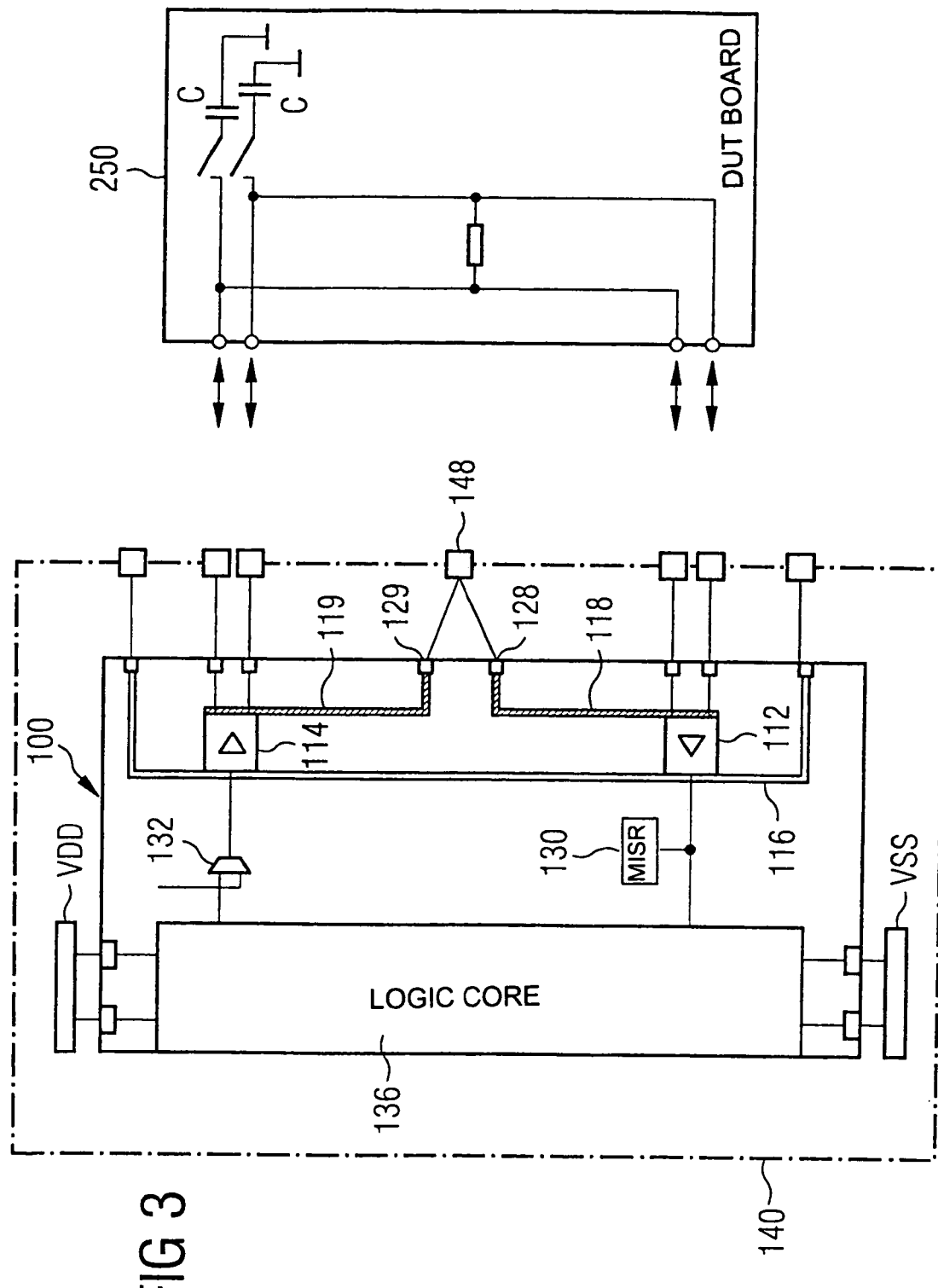
FIG. 3 shows a schematic illustration of a further exemplary embodiment of the invention in a test with a DUT board.

A test with separated supply voltage can only be effected on the wafer in the case of the semiconductor module 100, since the housed semiconductor module has only a single VDDP pin 148 for the positive supply voltage on the package 140 (FIG. 3). During the test on the wafer, the semiconductor module 100 is tested by means of a needle card 150. The latter contains connections 152, 154, which connect the corresponding pads 122a, 122b and 124a, 124b of the LVDS input 112 and LVDS output 114 to one another.

The connections can again be influenced capacitively, inductively or resistively via switches 156. In addition, FIG. 2 shows the possibility of modulating different low-frequency sinusoidal signals U1 and U2, respectively, on the two supply voltages. During the fast self-test, the fast frequency is provided by the PLL of the module 100 itself. Comprehensive test coverage is achieved by virtue of the modulated supply voltage fluctuations U1, U2 in combination with the PLL jitter that is really present. In this case, the LFSR/MISR circuit is situated upstream of the multiplexer circuit in the slow frequency range and is simple to realize.

With reference to FIG. 3, after the separation and packaging the two supply voltage pads 128, 129 in the package 140 are externally accessible only through a single pin 148, so that it is then not possible to effect the self-test with a separated supply voltage. However, a self-test is possible here, too, with a DUT board 250, similarly to the process described above in connection with FIG. 1.

I claim:

1. A semiconductor module with a configuration for the self-test of a plurality of bidirectionally operating interface circuits, comprising:

first and second equally sized groups of interface circuits, wherein each interface circuit of said first group is assigned exactly one interface circuit of said second group;

a respective electrical correction of the interface circuits of said first and second groups to outside of the semiconductor module, for enabling a self-test;

a first circuits connected to said first group and serving to generate test signals to be multiplexed in and output via said interface circuits of said first group;

a second circuit connected to said second group for receiving and processing test signals received via said interface circuits of said second group; and a respective separate voltage supply for said first and second groups of interface circuits.

2. The semiconductor module according to claim 1, which further comprises a third circuit connected to said second group and serving to generate test signals to be multiplexed in and output via said interface circuits of said second group; and wherein said second circuit is connected to said first group for receiving and processing test signals received via said interface circuits of said first group.

3. The semiconductor module according to claim 1, wherein said circuit for generating test signals includes a pseudorandom number generator.

4. The semiconductor module according to claim 1, wherein said circuit for generating test signals includes a linear feedback shift register.

5. The semiconductor module according to claim 1, wherein said circuit for receiving and processing test signals includes a circuit for calculating a signature from the test signals.

6. The semiconductor module according to claim 1, wherein said circuit for receiving and processing test signals includes a multiple input shift register.

7. A self-test method, which comprises the following steps:

providing a semiconductor module according to claim 1 and testing the bidirectionally operating interface circuits of the semiconductor module by connecting the assigned interface circuits of the first and second groups of interface circuits outside the module;

supplying the two groups of interface circuits with a separate supply voltage;

generating test signals, coupling in the test signals, and outputting the test signals via the first group of interface circuits;

receiving the test signals via the second group of interface circuits; and comparing the received test signals with prescribed values for fault-free functioning of the interface circuits.

8. The method according to claim 7, which comprises:

after processing the test signals output by the first group and received by the second group of interface circuits, reversing a test direction, such that the test signals generated by the circuit that interacts with the second group are output via the second group of interface circuits and are received via the first group of interface circuits; and receiving and comparing test signals with prescribed values for fault-free functioning of the interface circuits.

9. The method according to claim 7, which comprises generating test signals with pseudorandom distribution, calculating a signature from the received test signals, and comparing the signature with a prescribed signature for fault-free functioning of the interface circuits.

10. The method according to claim 7, which comprises influencing a connection of the assigned interface circuits in order to include an influence of interference quantities in the self-test.

11. The method according to claim 10, wherein the influencing step comprises selecting an influence from a group consisting of resistive, capacitive, and inductive influences.

12. The method according to claim 7, which comprises modulating low-frequency signal voltages onto at least one of the supply voltages of the interface groups.

13. The method according to claim 12, which comprises modulating two low-frequency sinusoidal signals of different frequency onto both supply voltages.

* * * * *